United States Patent
Habing et al.

(10) Patent No.: US 6,212,075 B1
(45) Date of Patent: Apr. 3, 2001

(54) ADAPTER KIT TO ALLOW EXTENDED WIDTH WEDGELOCK FOR USE IN A CIRCUIT CARD MODULE

(75) Inventors: Robert D. Habing; Thomas Allan Odegard, both of Albuquerque, NM (US)

(73) Assignee: Honeywell Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/223,289

(22) Filed: Dec. 30, 1998

(51) Int. Cl.[7] ....................................... H05K 7/20
(52) U.S. Cl. ..................... 361/719; 257/727; 403/409.1
(58) Field of Search ................. 403/409.1; 165/80.3, 165/185; 211/41.17; 257/726, 727; 361/704, 707, 711, 715, 719, 720, 801

(56) References Cited

U.S. PATENT DOCUMENTS

| | | | |
|---|---|---|---|
| 4,558,395 | 12/1985 | Yamada et al. | 361/385 |
| 4,751,963 | * 6/1988 | Bui . | |
| 4,777,561 | 10/1988 | Murphy et al. | 361/381 |
| 4,853,829 | 8/1989 | Buzzelli | 361/386 |
| 4,867,235 | 9/1989 | Grapes et al. | 165/185 |
| 4,879,634 | * 11/1989 | Storrow . | |
| 4,916,575 | 4/1990 | Van Asten | 361/386 |
| 4,994,937 | 2/1991 | Morrison | 361/386 |
| 5,253,963 | 10/1993 | Ries | 411/75 |
| 5,262,587 | 11/1993 | Moser | 174/15.1 |
| 5,280,411 | 1/1994 | Dirks et al. | 361/707 |
| 5,371,653 | 12/1994 | Kametani et al. | 361/721 |
| 5,414,592 | * 5/1995 | Stout . | |
| 5,482,109 | 1/1996 | Kunkel | 165/80.3 |
| 5,485,353 | * 1/1996 | Hayes . | |
| 5,532,430 | 7/1996 | Lanoe | 174/52.3 |
| 5,549,155 | 8/1996 | Meyer, IV et al. | 165/104.33 |
| 5,559,675 | 9/1996 | Hsieh et al. | 361/707 |
| 5,625,227 | 4/1997 | Estes et al. | 257/712 |
| 5,714,789 | 2/1998 | Estes et al. | 257/414 |
| 5,859,764 | * 1/1999 | Davis . | |
| 5,892,658 | * 4/1999 | Urda . | |

FOREIGN PATENT DOCUMENTS

| 2123638 | 8/1972 | (FR) | H05K/7/00 |
|---|---|---|---|
| 2103020 | 2/1983 | (GB) | H05K/7/20 |

* cited by examiner

Primary Examiner—Gerald Tolin
(74) Attorney, Agent, or Firm—Loria B. Yeadon; Andrew A. Abeyta

(57) ABSTRACT

An adapter for commercial off-the-shelf (COTS) circuit card modules resulting in increased cooling efficiency. COTS circuit card modules generally have at least one printed wiring board (PWB), at least one component mounted on the PWB, a heatsink or some type of heat path, a frame for supporting the cards, and a wedgelock for use with a conduction-cooled chassis. The adapter increases the cooling efficiency of such COTS modules while allowing them to remain compliant with IEEE 1101.2 Specifications. The invention is efficient in removing heat from the COTS circuit card modules as it increases the conduction contact area between the chassis cold wall and the COTS module. In addition, the adapter allows for the use of an extended width wedgelock to increase the clamping force over the conduction contact area. The extended width wedgelock is mounted to one surface of the frame such that when installed in a conduction-cooled chassis, the opposite frame surface is forced against the chassis cold wall. The increased wedgelock size approximately doubles the clamping force applied. The net effect of these improvements are a reduction in the thermal resistance per inch of wedgelock length. This, in turn, reduces the module to chassis interface temperature rise. The improved thermal resistances and decreased temperature rises boost the reliability of the COTS circuit cards, particularly in the stringent environments experienced in military applications.

5 Claims, 6 Drawing Sheets

ADAPTER KIT TO ALLOW EXTENDED WIDTH WEDGELOCK FOR USE IN A CIRCUIT CARD MODULE

I. CROSS-REFERENCE TO RELATED APPLICATIONS

This application is related to co-pending application, filed on even date herewith, entitled "Interchangeable Stiffening Frame With Extended Width Wedgelock For Use in a Circuit Card Module."

II. BACKGROUND OF THE INVENTION

The present invention pertains generally to the field of computer card modules and the frames contained within the modules. More specifically, the present invention relates generally to circuit card modules having frames that can be adapted to improve the cooling properties of the modules but optionally remain compliant with Institute of Electrical and Electronics Engineers (IEEE) specifications.

Commercially-available, off-the-shelf components that are included in circuit card modules are often unreliable when exposed to the high temperatures present in, for example, the military environment. This is due to the ineffectiveness of conventional methods of controlling component junction temperatures under stringent temperature conditions. Conventional cooling methods utilized in off-the-shelf parts include normal convection, forced convection—such as fan cooling, liquid cooling, various forms of heat conductors or sinks, etc.—and combinations of two or more of these methods. Numerous patents have issued to structural designs having cooling properties for use with circuit card modules. For example, U.S. Pat. No. 5,280,411, issued to Dirks et al. discloses the addition of heat conducting rails to the edges of a circuit card. Meyer, IV et al., in U.S. Pat. No. 5,549,155, teaches the use of a heat conductive pad and a heat pipe to disperse the unwanted heat from a computer chip. U.S. Pat. Nos. 5,532,430 and 5,559,675, of Lanoe and Hsieh et al., respectively, disclose heat dissipating structures for use with circuit cards. In U.S. Pat. No. 4,916,575, Van Asten discusses the use of a ribbed frame, which is structured to hold multiple cards. Several patents, including U.S. Pat. Nos. 4,558,395; 5,482,109; 5,714,789; and 5,625,227, disclose the use of a circulating coolant system to remove the generated heat. However, none of these patents disclose or suggest a structure that satisfies the IEEE 1101.2 standards (i.e., IEEE Standard for Mechanical Core Specifications for Conduction-Cooled Eurocards), which specifies convection-cooled chassis requirements and conduction-cooled chassis requirements.

The prior art has also recognized the utility of additional force at the contact points between module structures and the computer chassis. Morrison, U.S. Pat. No. 4,994,937, and Moser, U.S. Pat. No. 5,262,587, teach clamping structures to achieve this goal. Buzzelli, in U.S. Pat. No. 4,853,829, discloses a locking mechanism having a sliding block which holds the module to the heatsink plate. As mentioned above, none of these references appear to satisfy the IEEE standards of current interest.

The current methods for cooling commercial off-the-shelf circuit cards, such as Versa Module Eurocards (VMEs), are conduction-cooled modules that operate in a conduction-cooled chassis or a convection-cooled chassis, such as described in IEEE 1101.2 Specifications. In order to comply with the IEEE 1101.2 Specifications, the cards must be mechanically compliant with both chassis types. This requires an approximately 0.063" thick×0.098" wide protrusion along the card edge to engage the convection-cooled chassis card guides. This protrusion is often an extension of the printed wiring board (PWB) or machined as part of PWB. A challenge posed by the IEEE 1101.2 Specifications is that the card modules must be compatible with existing forced-air cooled chassis or racks, which do not use wedge-locks for heat exchange or mechanical mounting. Instead, the existing forced-air cooled chassis use the edge of the PWB as a guide and one of the mechanical attachment points for the chassis. In the convection-cooled configuration, air flow over the card is used to remove component heat. In the conduction-cooled configuration, the component heat is removed by conduction to the chassis cold wall. The heat is then removed from the chassis by external means. The protrusion reduces the efficiency of heat removal by reducing the available conduction contact area and by reducing the size of the wedgelock that can be used. These two effects reduce the efficiency of movement of the heat to the cold wall of the chassis. Because of these legacy requirements, the conduction-cooled modules do not take full advantage of the area available at the cold wall of the chassis.

Accordingly, it is an object of the present invention to provide an adapter for COTS circuit card modules resulting in improved cooling efficiency.

It is a further object of the present invention to improve the cooling efficiency of the circuit card module by developing an adapter for existing circuit card modules which provides a more direct path for the dissipation of heat from the components of the circuit card modules.

It is still a further object of the present invention to improve the cooling efficiency of the module through the use of an extended width (larger) wedgelock.

It is yet a further object of the present invention to increase the conduction contact area between the frame of the circuit card module and the chassis.

III. BRIEF SUMMARY OF THE INVENTION

The following summary of the invention is provided to facilitate an understanding of some of the innovative features unique to the present invention, and is not intended to be a full description. A full appreciation of the various aspects of the invention can only be gained by taking the entire specification, claims, drawings, and abstract as a whole.

The present invention is an adapter kit for commercial off-the-shelf (COTS) circuit card module that has increased cooling efficiency when placed in a conduction-cooled chassis. Generally, COTS circuit card modules comprises one or more printed wiring boards (PWB), at least one component mounted on the PWB, and a heatsink that creates a heat path from the component to the chassis, and a wedgelock for securing the module to the conduction-cooled chassis. The adapter frame of the present invention comprises an extended width wedgelock (13), an extended width shim (15), and an extension (16) to the existing frame (1) so that the circuit card module contacts the cold wall of the conduction-cooled chassis (2). The present invention is compatible with the IEEE 1101.2 Spechfications. The present invention increases the conduction contact area between the chassis cold wall and the module. In accordance with the present invention, existing wedgelocks are increased in width from approximately 0.25" to approximately 0.35". In the present invention, the wedgelock is mounted to one surface of the frame such that when installed in a conduction-cooled chassis, the opposite frame surface is forced against the chassis cold wall. The increased wedgelock size approximately doubles the clamping force applied with respect to conventional modules. The net effect of these improvements are a reduction in the thermal resistance per inch of wedgelock length in the range of, for example, approximately 2° C.-in/W to approximately 1° C.-in/W. This, in turn, reduces the module to chassis interface temperature rise. The improved thermal resistances and decreased temperature rises boost the reliability of the COTS circuit cards as compared to the prior art, particularly in the stringent environments experienced in military applications.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

IV. BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

V. DETAILED DESCRIPTION OF THE INVENTION

The discussion of FIGS. 1 through 5 is related to a new stiffening frame (i.e., FIGS. 2, 4, and 5) that is being filed as a patent application on even date herewith with a title of "Interchangeable Stiffening Frame With Extended Width Wedgelock For Use in a Circuit Card Module" by the same inventors of the present invention. The discussion of FIGS. 1 through 5 provides a discussion of the problems experienced in the art and solutions thereto, and thus, this discussion has been retained for an understanding of the present invention. The present invention is depicted in FIG. 6 and the discussion thereof.

Figure 1:
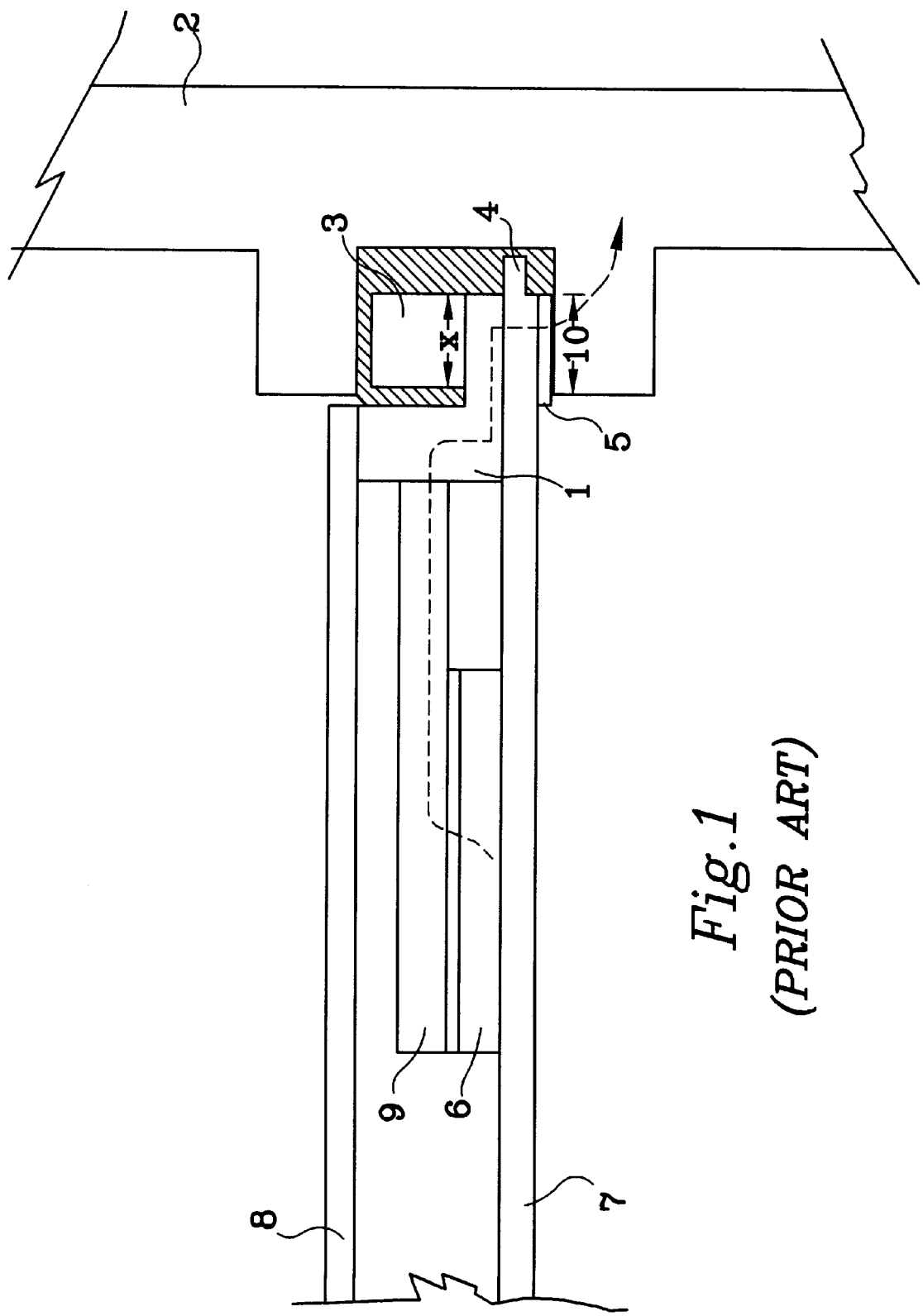
FIG. 1 illustrates a cross-sectional view of a prior art COTS circuit card module installed in a conduction-cooled chassis (fully compliant with IEEE 1101.2 Specifications).

Referring to FIG. 1, there is shown a cross-sectional view (top or side view) of a conventional circuit card module design installed in a conduction-cooled chassis 2. The module of FIG. 1 comprises two circuit cards: a mezzanine card 8 and a base card 7 although the number and type of cards can vary. A plurality of electrical components 6 (e.g., integrated circuits, high-power die-up devices, etc.) are mounted (e.g., soldered, ball grid array, etc.) on circuit cards 7 and 8, although FIG. 1 illustrates component 6 mounted on card 7 only. Component 6 generates heat during its normal operation, and two thermal paths for heat removal are provided. The first thermal path is through the lower surface of component 6 to the end of circuit card 7 to chassis cold wall 2 via metal strip 5 (or shim). The metal strip 5 acts both as a heatsink and as protection for the card 7 against damage when it is inserted and removed from the chassis 2. The other thermal path for component 6 (shown by the dotted arrow in FIG. 1), and the primary one of interest, is through the top surface of component 6 to thermally-conductive heatsink 9 to module frame 1 and to chassis cold wall 2 via card 7 and metal strip 5. Optionally, heatsink 9 and frame 1 can be constructed from one piece of material. The heat efficiency of this thermal path is directly affected by the clamping force exerted by wedgelock 3 (i.e., the higher the pressure, the lower the thermal resistance) and the contact area 10 between the cold wall chassis and the card 7 or strip 5 depending upon the configuration (i.e., strip 5 may not always be present). An end portion of the circuit card 7 often includes a protrusion 4 (often machined from base card 7), which allows this module to be compliant with a convection-cooled chassis as defined in IEEE 1101.2 Specifications (see, e.g., FIG. 3 for a conventional 1101.2 compliant module used in a convection-cooled chassis). The problematic thermal resistances in the module of FIG. 1 include the resistance between the metal strip 5 and the chassis cold wall 2 (e.g., about 0.23 C/W), between the metal strip 5 and the card 7 (e.g., about 0.3 C/W), and between the card 7 and the frame 1 (e.g., about 0.11 C/W). The hatch marks in FIG. 1 represent air gaps. The module of FIG. 1 fails to use approximately 40% of the cold wall of chassis 2 surface contact area available for thermal conduction; it uses only the surface contact area 10 for thermal conduction, which is typically about 0.25" in width. Additionally, for IEEE 1101.2 purposes, the module must be compliant with the convection-cooled chassis (see, e.g., FIG. 3) so it typically includes the protrusion 4.

Figure 2:
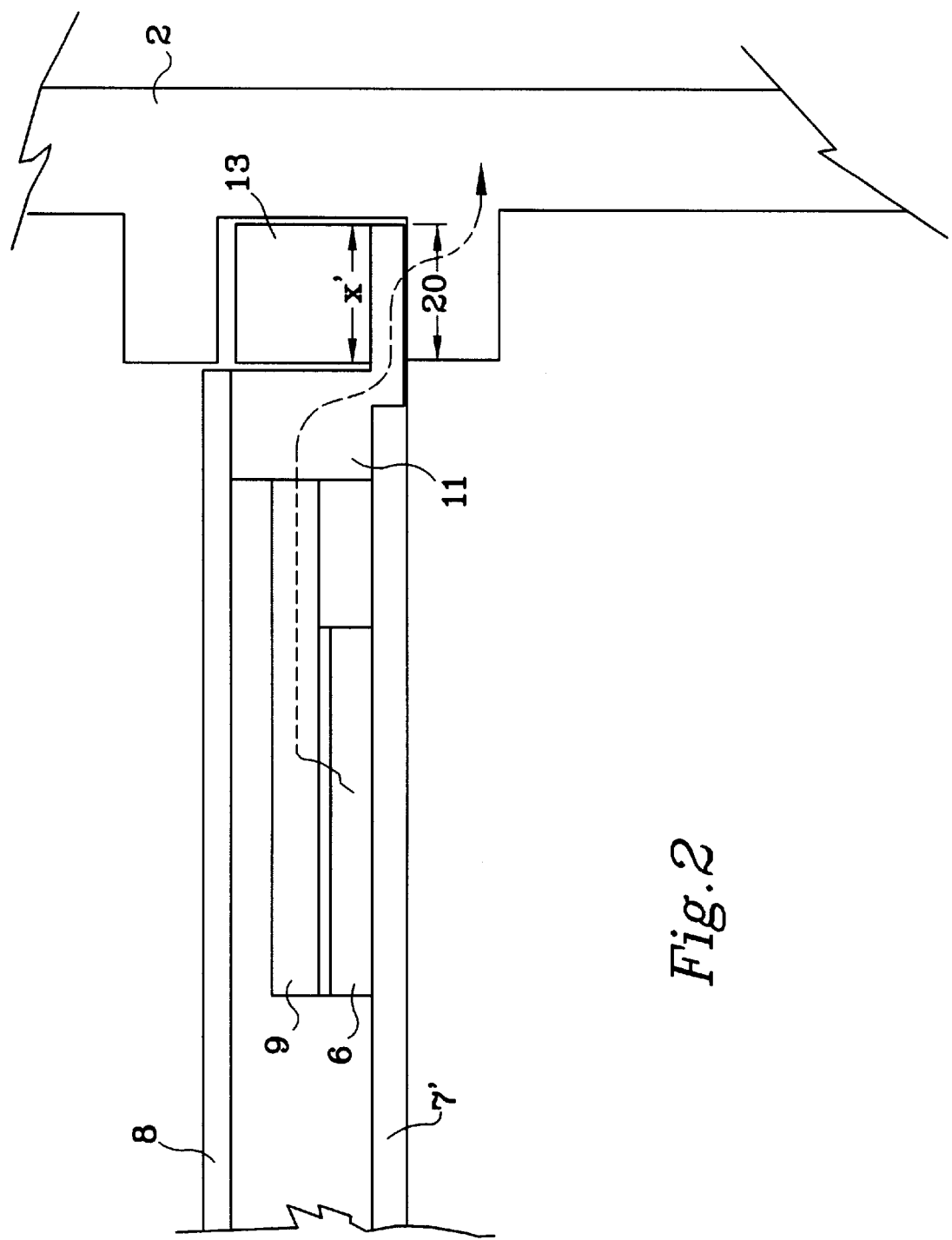
FIG. 2 illustrates a cross-sectional view of a new stiffening frame installed in a conduction-cooled chassis (partially compliant with IEEE 1101.2 Specifications).

In contrast, the module illustrated in FIG. 2, an embodiment of the new stiffening frame, has improved cooling efficiency when used in a conduction-cooled chassis 2. The improved cooling efficiency is achieved, at least in part, through the use of a larger wedgelock 13. In the embodiment of FIG. 2, the wedgelock 3 of FIG. 1 is increased in width from x to x', e.g., from about 0.25" to about 0.35". The increased width x' of the wedgelock 13 identically increases the contact area 20 between the frame 11 and the chassis cold wall 2. A second important result of the alteration or augmentation is that the frame 11 (a restructured frame 1 of FIG. 1) is in direct contact with chassis 2, which results in a more direct thermal path. The card 7' is either the same card 7 of FIG. 1 pulled back to allow for the placement of frame 11 or a modified/shortened version of card 7 with the protrusion 4 removed. The restructuring results in a frame 11 that optionally eliminates the protrusion 4 of FIG. 1 necessary for use with convection-cooled chassis (but not necessary in a conduction-cooled chassis) or optionally maintains the protrusion as in FIGS. 4 and 5. Further, the frame 11 eliminates the need for the metal strip 5 of FIG. 1. It should be noted that a reduction and simplification in thermal resistances is realized in the embodiment illustrated in FIG. 2, where it is reduced to about 0.1 C/W between the frame 11 and chassis 2 cold wall. In summary, the larger surface contact area between the frame 11 and chassis 2 cold wall as well as the additional clamping force from the larger wedgelock 13 results in overall lower component running temperatures for this embodiment. The embodiment of FIG. 2 is partially compliant with the IEEE 1101.2 Specifications as it does not include a protrusion for use in a convection-cooled chassis. Embodiments having frames that maintain the protrusion and still use a larger wedgelock for increased cooling efficiency are also contemplated, and are discussed below with respect to FIGS. 4 and 5.

A commercially-available wedgelock 13 suitable for use in the present invention is the Card-Lok product which can be obtained from Calmark Corp., San Gabriel, Calif. In particular, the adapter frame structure of the present invention is designed to allow the use of large wedgelocks, e.g., those utilizing larger screws such as 6-32, 8-32, or 10-32 size screws. As described above, the removal of the protrusion 4 allows for an increase in the width of the contact surface between the frame 1 and chassis 2 by from about 0.25" to about 0.35". Not only is there an increase in the surface contact area of the wedgelock 13 that is in contact with the other parts of the circuit card module, but the larger wedgelock 13 exerts greater force between the frame 1 to the chassis cold wall 2 than the smaller wedgelock 3 of the prior art. As clamping force is increased, the interface conductance is increased, thus increasing the efficiency of heat movement from the component 6 to the cold wall of chassis 2. Optionally, the clamping force can be further increased by using a wedgelock 13 that has a friction-reducing finish applied to it and by installing the wedgelock 13 with washers. Wedgelocks made of aluminum are preferred, although other materials can be used.

The increased force, in combination with the additional contacting surface areas, significantly reduces the thermal resistance between the frame and the chassis 2 cold wall. In particular, typical thermal resistances across the wedgelock of conduction-cooled VME 6U modules is about 2° C. in/W. Thus, with an approximately 40 Watt (W) module, for example, there is an average 8.3° C. temperature rise. This temperature rise is significantly avoided using the adapter of the present invention. The reduction of thermal resistances and temperature rises is reflected in a reduced running temperature for component 6.

Figure 3:
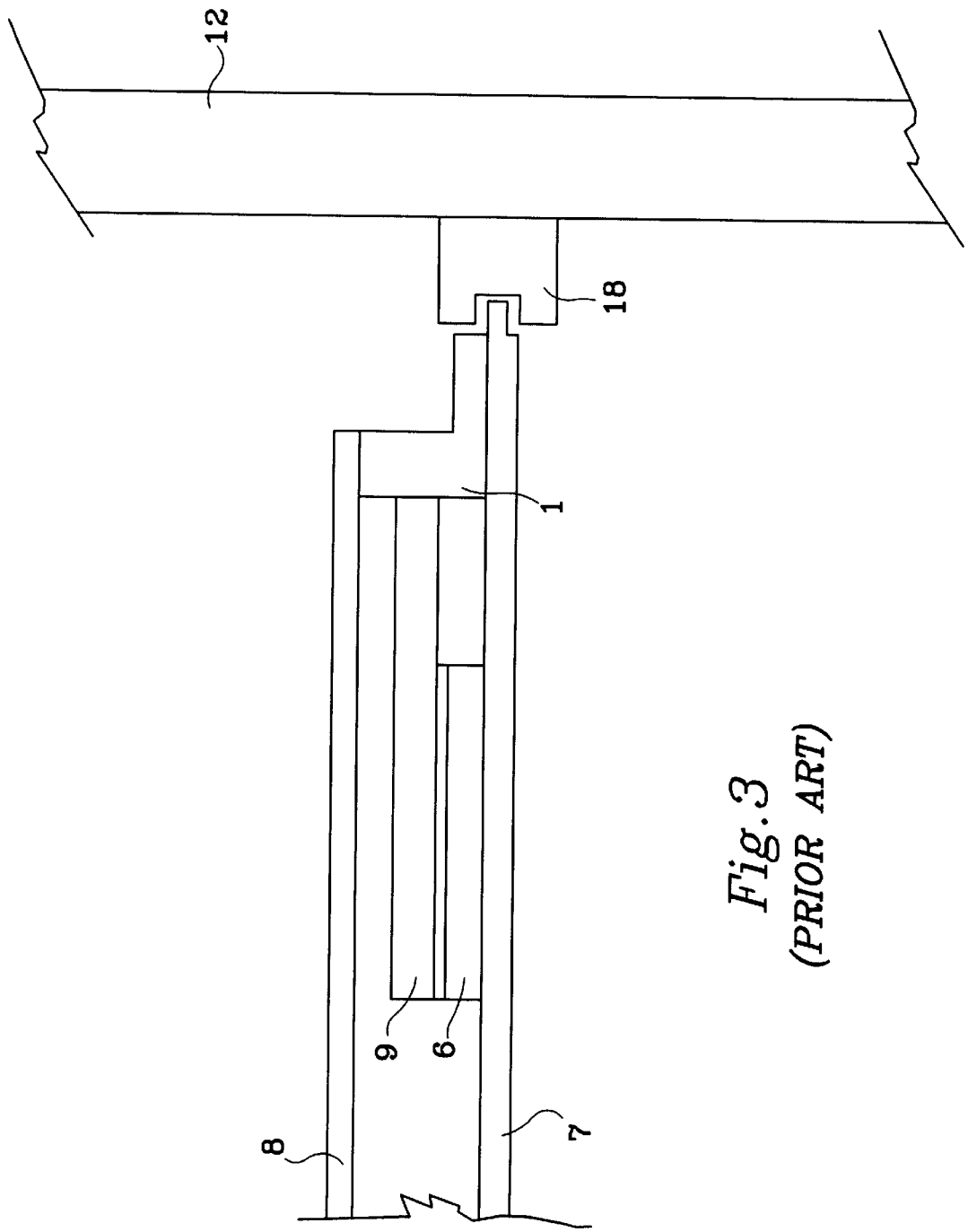
FIG. 3 illustrates a cross-sectional view of a prior art circuit card module installed in a convection-cooled chassis (fully compliant with IEEE 1101.2 Specifications).

Referring to FIG. 3, there is shown a prior art circuit card module that is compliant with the IEEE 1101.2 Specifications and is installed in a convection-cooled chassis 12. A card guide 18 is attached to the convection-cooled chassis 12 with for example, screws, for receiving the card 7 by its protrusion 4. In a conduction-cooled chassis, on the other hand, the channel for receiving the protrusion 4 is machined into the chassis 2 itself as shown in FIGS. 1, 2, 5, and 6. The remaining structure of the circuit card module in FIG. 3 is similar to that discussed above with respect to FIG. 1 (similar reference numerals indicate similar components), with the exclusion of wedgelock 3 and strip 5 which are not present in convection-cooled applications, and need not be discussed again as its structure will be apparent to those skilled in the art. In a convection-cooled chassis as shown in FIG. 3, airflow, for example, over the circuit card module removes the heat to the ambient environment.

Figure 4:
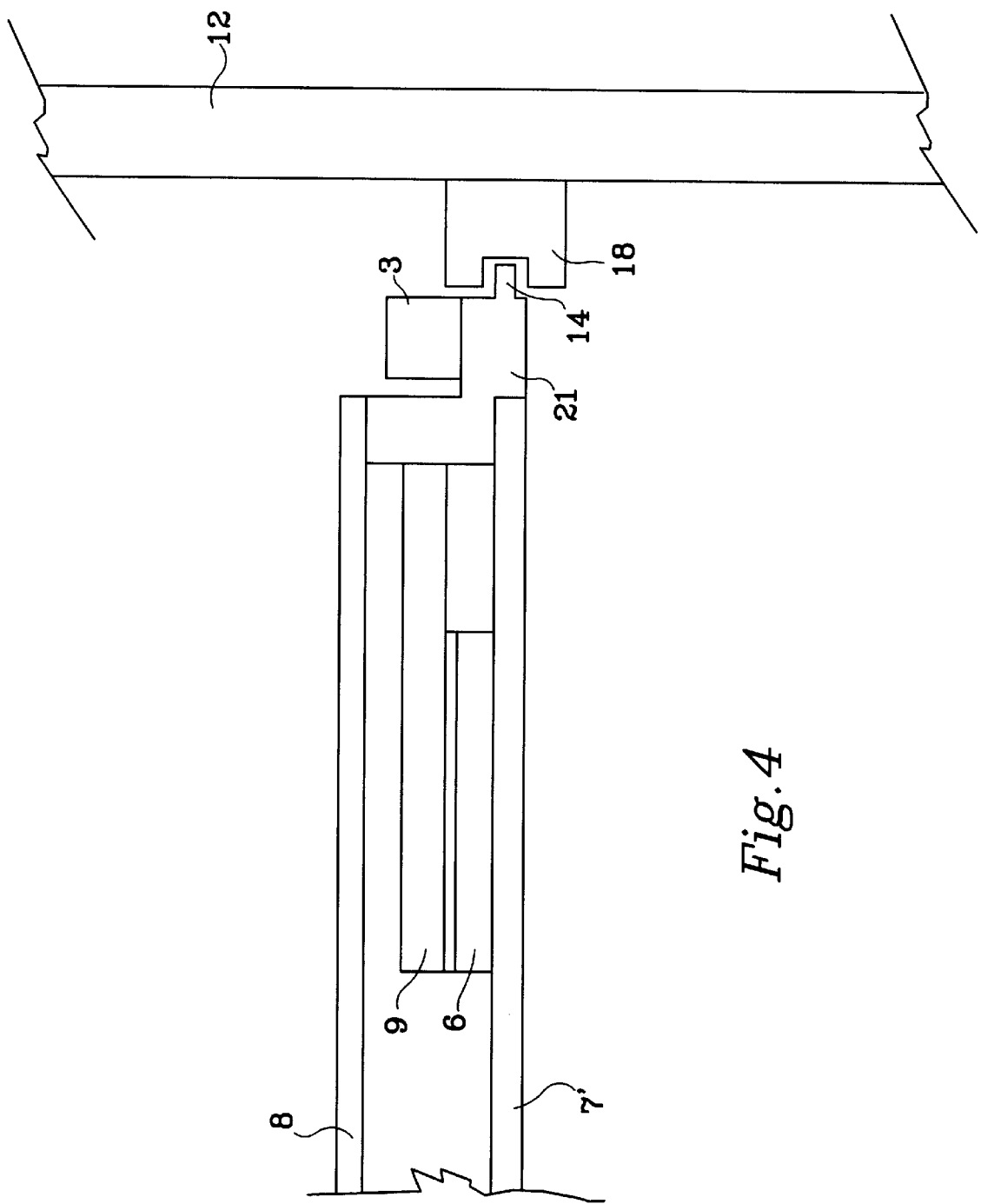
FIG. 4 illustrates a cross-sectional view of an alternate embodiment of the new stiffening frame installed in a convection-cooled chassis (fully compliant with IEEE 1101.2 Specifications).

Referring to FIG. 4, there is shown an alternate embodiment of the new stiffening frame installed in a convection-cooled chassis 12. The circuit card module comprises a frame 21, which includes a protrusion 14 that fits in the card guide 18 of the chassis 12 as shown. Although the wedgelock 3 would most likely be used in practice, a larger wedgelock can also be used in this alternate embodiment. The frame 21 allows for a larger wedgelock to be used and for the strip 5 to be eliminated. The remaining structure of the circuit card module in FIG. 4 is similar to that discussed above with respect to FIG. 2 (similar reference numerals indicate similar components) and need not be discussed again as its structure will be apparent to those skilled in the art. However, in the event that the circuit card module is to be used in commercial (non-military) applications and convection cooled, then the wedgelock 3 would not be present. It is contemplated, however, that certain convection-cooled applications would require the use of an extended width wedgelock and thus, it is shown for purposes of illustration. For example, if the circuit card modules are integrated (first tested) in a commercial, convection-cooled chassis in a laboratory environment and then installed into the actual chassis, then an extended width wedgelock would be used.

Figure 5:
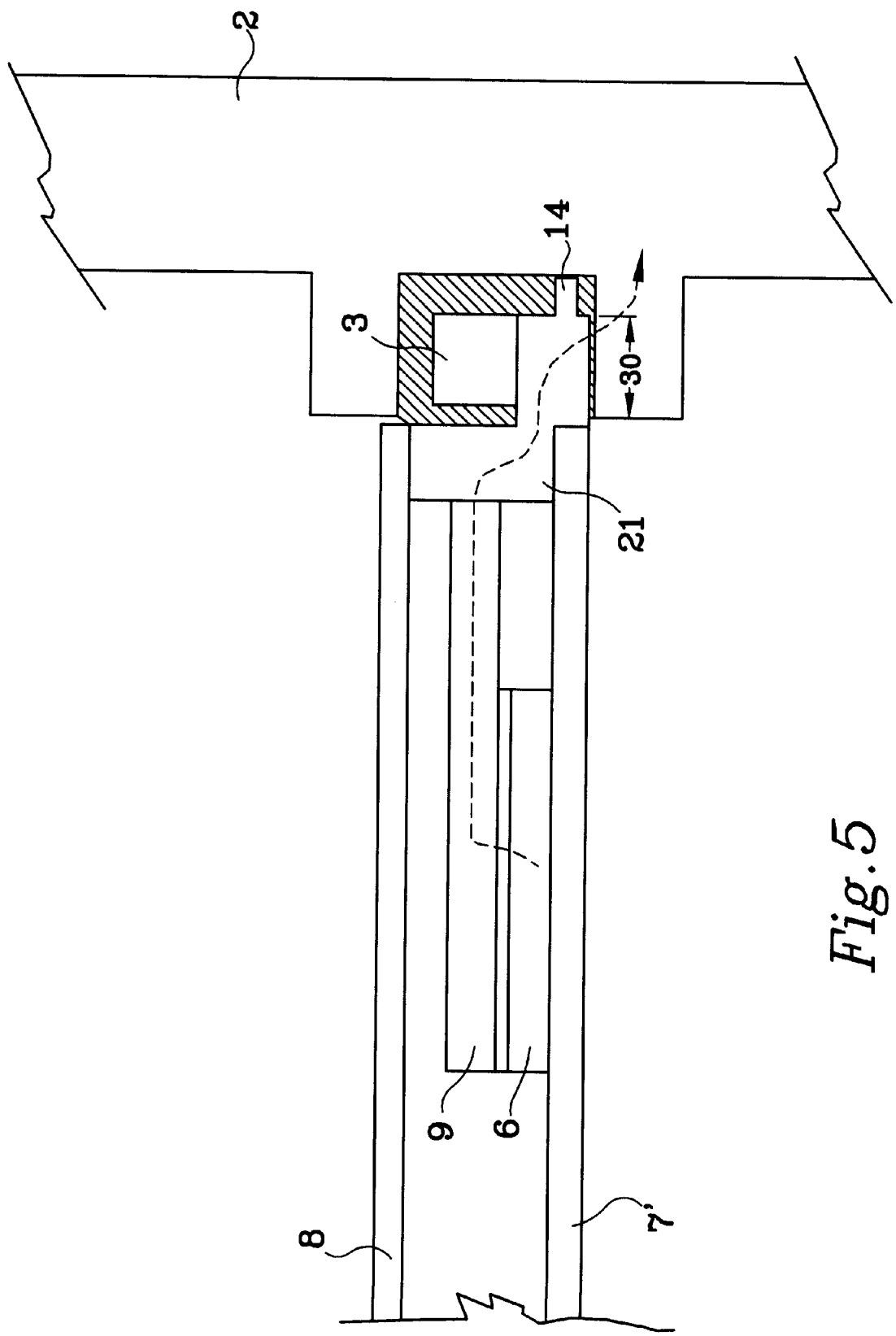
FIG. 5 illustrates a cross-sectional view of the alternate embodiment of the new stiffening frame installed in a conduction-cooled chassis (fully compliant with IEEE 1101.2 Specifications).
Figure 6:
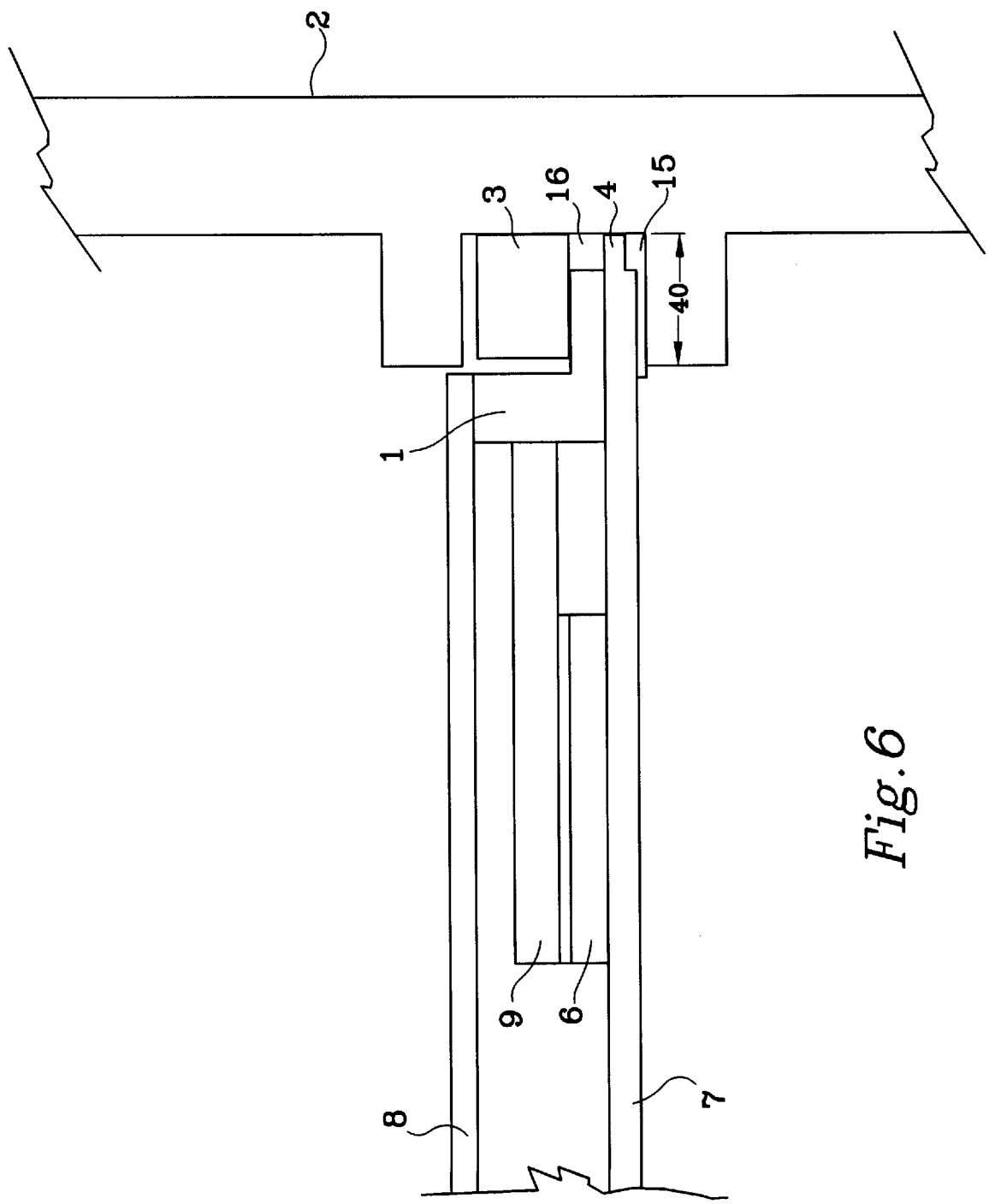
FIG. 6 illustrates a cross-sectional view of a COTS circuit card module modified with an adapter to increase thermal efficiency in accordance with the present invention.

Referring to FIG. 5, there is shown the embodiment as illustrated in FIG. 4 except that the circuit card module is mounted in a conduction-cooled chassis 2. This embodiment has a protrusion 14 and thus, is compliant with the IEEE 1101.2 Specifications. Similar to the embodiment of FIG. 2, the embodiment of FIG. 5 has increased cooling efficiency but remains compatible with a convection-cooled chassis 12. In the embodiment of FIG. 5, however, the surface contact area 30 is not as large as the surface contact area 20 in FIG. 2. Also similar to the embodiment of FIG. 2, a reduction and simplification in thermal resistances is realized in the embodiments illustrated in FIG. 5, where it is reduced to only between the frame 21 and chassis cold wall 2 (strip 5 is eliminated). In any event, an extended width wedgelock allows for greater surface contact area 30 to improve the thermal performance.

Referring to FIG. 6, there is shown a cross-sectional view of a COTS circuit card module modified with the adapter of the present invention to increase thermal efficiency using the principles described above (i.e., greater pressure from an extended width wedgelock, increased surface contact area 40, and extended frame to increase the conduction contact area). The circuit card module of FIG. 6 does not necessarily have to be compliant with the IEEE 1101.2 Specifications and can be any commercially-available circuit card. Many of the COTS conduction-cooled VME circuit card modules suffer from the thermal problems described above. The adapter of the present invention shown in FIG. 6 allows COTS circuit card modules to obtain the improved thermal performance and be in compliance with IEEE 1101.2 Specifications when used in a conduction-cooled chassis. The premise behind the present invention is to provide a wedgelock/chassis interface modification kit to existing modules to increase the cold wall contact area for improved cooling efficiency without a complete redesign of the PWB mechanical interface. The adapter of the present invention requires the removal of the COTS backside abrasion strip (strip 5 in FIG. 1), and potentially replacement of wedgelock 3 with an extended width wedgelock. These items are replaced with the adapter of the present invention to increase the surface area contract between the cold wall of the chassis and the strip in contact with card 7 without impacting the COTS design. Once adapted, however, the COTS module is not backwards compatible with the convection-cooled type racks. As can be seen from FIG. 6, elements 3 (which can have an extended width), 16 and 15 combine to increase the conduction contact between the COTS circuit card module and the cold wall of the chassis 2.

In the circuit card module of FIG. 6, the strip 15 (an element of the adapter) fully cooperates with the bottom surface of the card 7 and its protrusion 4 for an increased surface contact area 40, i.e., the air gaps of FIG. 1 (shown by hatch marks) between the chassis cold wall, the card 7, and the strip 5 are substantially filled by the adapter of the present invention. The frame 1 is either adapted with another piece of material extension 16 to extend to the chassis 2 cold wall or is constructed of one piece (frame 1 integrated with extension 16). The adapter allows the COTS circuit card module to fully utilize the surface contact area 40 between the underside of card 7 and the chassis 2 cold wall, and optionally, the contact area between the wedgelock and frame 1 with extension 16. Thus, the surface contact area between the circuit card module is increased and the thermal performance improved without impacting the existing COTS design. Also, the wedgelock 3 can be an extended width wedgelock as described above with respect to FIGS. 2, 4, and 5 to further increase the contact area with the frame 1 and extension 16. Comparing the COTS card module of FIG. 1 with that of FIG. 6, it can be seen that the air gaps (shown by hatch marks in FIG. 1) have been substantially filled by the adapter (i.e., elements 15 and 16) of the present invention. In particular, the frame 1 is extended with extension 16 to utilize the contact area 40, the width of wedgelock 3 can be extended, and the strip 15 fully utilizes the space under the protrusion 4. The configuration of FIG. 6 significantly reduces the thermal resistance between card 7, strip 15, and chassis 2 cold wall, which reduces the overall junction temperature of the components resulting in improved module reliability.

Predictions using standard thermal analysis software were preformed to measure the expected improvements with the various embodiments of the adapter frame. The analysis showed that the conventional design, as illustrated in FIG. 1, had a component running temperature of about 98° C. The embodiment illustrated in FIG. 6 had a component running temperature of about 93° C. Such a reduction in running temperatures significantly increases the reliability of the circuit card module, particularly when subjected to the environmental temperatures present when the cards are used in military applications. An additional manner in which to analyze the increased ability of the adapter frame to dissipate heat is to examine the difference in the temperature rise from the base 71° C. chassis to the component junction. The present invention has the ability to more effectively and dramatically transfer heat from the component 6 of a circuit card to the chassis 2 cold wall.

Other variations and modifications of the present invention will be apparent to those of skill in the art, and it is the intent of the appended claims that such variations and modifications be covered. The particular values and configurations discussed above can be varied and are cited merely to illustrate a particular embodiment of the present invention and are not intended to limit the scope of the invention. It is contemplated that the use of the present invention can involve components having different characteristics as long as the principle is followed, i.e., the presentation of an adapter to existing frames of COTS circuit card modules for improving their thermal efficiency allowing for a larger surface area contact between the chassis and the frame. It is intended that the scope of the present invention be defined by the claims appended hereto.

The embodiments of an invention in which an exclusive property or right is claimed are defined as follows:

1. An improvement to an existing commercial off-the-shelf (COTS) circuit card module cooperating with a conduction-cooled chassis that receives the circuit card module resulting in increased cooling efficiency, the circuit card module having at least one printed wiring board (PWB), the PWB having a protrusion at one end thereof, at least one component operatively connected to the PWB, a heat path between the component and the chassis, and a frame in contact with the PWB for stiffening the PWB, the improvement comprising:

an adapter, wherein said adapter comprises a thermally conductive strip affixed to a bottom surface of the PWB, wherein said strip comprises a predetermined surface area of the PWB and the protrusion and extends over the protrusion, and a frame extension affixed to a top surface of the protrusion, wherein said frame extension comprises substantially all of a top surface area of the protrusion.

2. The circuit card module of claim 1, wherein said frame extension comprises an integrated frame extension with the frame.

3. The circuit card module of claim 1, wherein said adapter is constructed of two pieces.

4. The circuit card module of claim 1, further comprising an extended width wedgelock comprising a surface area of a predetermined frame surface area and a frame extension surface area that secures said adapter to the chassis via pressure, wherein the extended width wedgelock causes a pressure to be exerted over the increased surface area between said adapter and the chassis.

5. The circuit card module of claim 4, wherein said wedgelock has a thermal resistance per inch of wedgelock length of no greater than 1 C.-in/W.

* * * * *